United States Patent
Jensen

(10) Patent No.: US 11,540,410 B2
(45) Date of Patent: Dec. 27, 2022

(54) FASTENING SYSTEM FOR SINGLE OR MULTIPLE ELECTRONIC DEVICE INSTALLATIONS

(71) Applicant: SK hynix Inc., Icheon-si (KR)

(72) Inventor: Alexander Geoffrey Jensen, Los Gatos, CA (US)

(73) Assignee: SK hynix Inc., Icheon-si (KR)

( * ) Notice: Subject to any disclaimer, the term of this patent is extended or adjusted under 35 U.S.C. 154(b) by 463 days.

(21) Appl. No.: 16/722,576

(22) Filed: Dec. 20, 2019

(65) Prior Publication Data

US 2021/0195782 A1    Jun. 24, 2021

(51) Int. Cl.
| | |
|---|---|
| *H05K 7/14* | (2006.01) |
| *G06F 3/06* | (2006.01) |
| *H05K 1/18* | (2006.01) |
| *G06F 1/18* | (2006.01) |

(52) U.S. Cl.
CPC .......... *H05K 7/1405* (2013.01); *G06F 1/185* (2013.01); *G06F 3/0683* (2013.01); *H05K 1/182* (2013.01); *H05K 2201/10159* (2013.01)

(58) Field of Classification Search
CPC .... H05K 1/14; H05K 1/141–144; H05K 1/18; H05K 1/181–187; H05K 3/368; H05K 2201/10158–10159; G06F 1/185; G06F 3/3683
USPC ......... 361/736–759, 801–803; 439/326–327, 439/356–358
See application file for complete search history.

(56) References Cited

U.S. PATENT DOCUMENTS

| | | | | |
|---|---|---|---|---|
| 5,566,049 A | * | 10/1996 | Nguyen | ............... G11B 33/128 |
| 5,943,218 A | * | 8/1999 | Liu | ...................... H05K 7/1405 |
| | | | | 361/801 |
| 6,056,579 A | * | 5/2000 | Richards, III | ....... H05K 7/1454 |
| | | | | 439/358 |
| 6,176,727 B1 | * | 1/2001 | Liu | .................... H01R 12/7005 |
| | | | | 439/358 |
| 6,621,714 B1 | * | 9/2003 | Li | ............................ F16L 3/23 |
| | | | | 361/801 |
| 6,778,401 B1 | | 8/2004 | Yu et al. | |
| 7,102,895 B1 | * | 9/2006 | Copple | ................ H05K 7/1418 |
| | | | | 361/801 |
| 7,145,778 B2 | | 12/2006 | DeLuga et al. | |

(Continued)

FOREIGN PATENT DOCUMENTS

| | | |
|---|---|---|
| CN | 101425324 | 5/2009 |
| CN | 203733049 | 7/2014 |

(Continued)

*Primary Examiner* — Tuan T Dinh
(74) *Attorney, Agent, or Firm* — Weaver Austin Villeneuve & Sampson LLP

(57) ABSTRACT

Electronic device fastening systems that enable one or more electronic devices to be reliably and quickly secured on a host board and electronic systems made of the same. In a specific exemplary embodiment, a retainer clip spans across the width of one or more electronic devices, engages with the board and snaps into place. The clip includes one or retaining posts such that when the clip engages the board, the one or more retaining posts align and engage with a predefined mounting feature of a corresponding one of the one or more electronic devices, thereby securing the electronic device in place to restrict horizontal, lateral, and vertical movement of the electronic device.

20 Claims, 3 Drawing Sheets

(56) References Cited

U.S. PATENT DOCUMENTS

| | | | |
|---|---|---|---|
| 7,768,789 B2 | 8/2010 | Ni et al. | |
| 8,251,729 B2 | 8/2012 | Shin et al. | |
| 8,305,103 B2 | 11/2012 | Kang et al. | |
| 8,717,752 B2 | 5/2014 | Dunham et al. | |
| 2013/0237086 A1* | 9/2013 | Chang | H01R 13/46 |
| | | | 439/374 |
| 2017/0017600 A1* | 1/2017 | Breakstone | G06F 13/4022 |
| 2018/0210517 A1 | 7/2018 | Yun | |

FOREIGN PATENT DOCUMENTS

| | | |
|---|---|---|
| CN | 109116933 | 1/2019 |
| KR | 200443263 | 1/2009 |
| KR | 100925992 | 11/2009 |
| KR | 100999565 | 12/2010 |
| KR | 101677709 | 11/2016 |
| KR | 101715227 | 3/2017 |
| KR | 101954293 | 3/2019 |
| WO | 2016008718 | 1/2016 |

\* cited by examiner

FASTENING SYSTEM FOR SINGLE OR MULTIPLE ELECTRONIC DEVICE INSTALLATIONS

BACKGROUND OF THE INVENTION

Electronic systems, such as desktop computers, servers, laptops, smart phones and the like use electronic devices, such as data storage devices, to operate. One example of an electronic device is the Solid State Drive (SSD) which typically includes memory circuitry such as flash memory along with a controller. In various applications, from computer systems to manufacturing environments, electronic devices such as SSDs have to be secured on a substrate or a board such as an add-in-card (AIC) or a printed circuit board (PCB). The process of securing an electronic device onto a board may damage the device. For example, one type of SSD known as an M.2 SSD, is a relatively flat rectangular shaped device that is internally mounted and does not include a protective case. Components on the M.2 SSD are therefore fully exposed and as a result can be easily knocked loose or damaged by external forces introduced during handling and installation. Moreover, the device PCB itself can be damaged as a result of bending when the device is inserted into, or removed from, the host without proper handling. Current mechanisms for securing electronic devices on a board either require the operator to use a driver to torque a fastener such as a screw to secure the device, or to press down on the device to engage a spring-finger mechanism that retains the device in place. The force exerted directly on the electronic device during installation in such mechanisms can cause damage to the device components and/or the board. Furthermore, these mechanisms of fastening the electronic device on an AIC or PCB are typically designed for single device installations. In certain environments such as testing devices during manufacturing, such single device fastening mechanisms increase the time it takes to test and debug multiple devices, thereby decreasing production volume as well as increasing cost.

There is therefore a need for a more reliable mechanism to quickly and efficiently install one or more electronic devices on a board in an easily repeatable manner.

BRIEF SUMMARY OF THE INVENTION

Embodiments of the present disclosure relate to electronic device fastening systems that enable one or more electronic devices to be reliably and quickly secured on a host board and electronic systems made of the same. In a specific exemplary embodiment, a retainer clip spans across the width of one or more electronic devices, engages with the board and snaps into place. The clip includes one or more retaining posts such that when the clip engages the board, the one or more retaining posts align and engage with a predefined mounting feature of a corresponding one of the one or more electronic devices, thereby securing the electronic device in place to restrict horizontal, lateral, and vertical movement of the electronic device.

In one embodiment, an apparatus for fastening one or more electronic devices to a substrate such as a circuit board includes a retainer clip having a longitudinal span that accommodates the one or more electronic devices where each electronic device has a predetermined width. At a first end of the span is formed a first board engagement feature, and at a second end of the span is formed a second board engagement feature. On an inner surface of the span of the retainer clip is formed one or more retaining posts that are positioned based on the predetermined width of the one or more electronic devices in order to align with and engage a mounting feature of the one or more electronic devices. When the one or more electronic devices are mounted on the board, the first board engagement feature of the retainer clip engages the board via a first predefined mounting feature formed in the board, and the second board engagement feature of the retainer clip engages a second predefined mounting feature formed in the board, positioning the span and the one or more retaining posts such that the one or more electronic devices are securely and reliably installed on the board.

In another embodiment, an electronic assembly includes a circuit board with a plurality of board connectors installed side by side on a first surface of the circuit board, with a first plurality of electronic devices each with a mating connector inserted into a corresponding one of the first plurality of board connectors. The assembly further includes a first retaining clip with a span section having a first board engagement feature at a first end of the span section and a second board engagement feature at a second end of the span section. The first retaining clip further comprising a plurality of retaining posts protruding from an inner surface of the span section, the plurality of retaining posts being positioned based on a predetermined width of each of the first plurality of electronic devices. Whereby, when the first retaining clip engages the circuit board over the first plurality of electronic devices, the plurality of retaining posts of the first retaining clip align with and engage a corresponding mounting feature of a respective one of the first plurality of electronic devices.

In a variation of the above electronic assembly embodiment, the assembly further includes a second plurality of board connectors installed side by side on a second surface of the board opposite the first surface of the board, with a second plurality of electronic devices each with a mating connector inserted into a corresponding one of the second plurality of board connectors. The assembly further including a second retaining clip with a span section having a first board engagement feature at a first end of the span section and a second board engagement feature at a second end of the span section. The second retaining clip further comprising a plurality of retaining posts protruding from an inner surface of the span section, the plurality of retaining posts being positioned based on a predetermined width of each of the second plurality of electronic devices. Whereby, when the second retaining clip engages the board over the second plurality of electronic devices, the plurality of retaining posts of the second retaining clip align with and engage a corresponding mounting feature of a respective one of the second plurality of electronic devices.

In yet another embodiment, multiple retaining clips of the type described above are deployed to retain a larger plurality of electronic devices on one or both sides of the electronic assembly board.

A better understanding of the nature and advantages of embodiments of the present disclosure may be gained with reference to the following detailed description and the accompanying drawings. It is to be understood, however, that each of the figures is provided for the purpose of illustration only and is not intended as a definition of the limits of the scope of the disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

A detailed description of various exemplary embodiments of the present disclosure is provided below along with accompanying figures that illustrate aspects of the exemplary embodiments. It is to be understood that specific details set forth below are exemplary and are for purposes of providing a better understanding of the various aspects of the invention as well as to provide those skilled in this art with an enabling description for implementing various embodiments. The scope of the invention is not limited to the specific and exemplary embodiments described herein.

Figure 1:
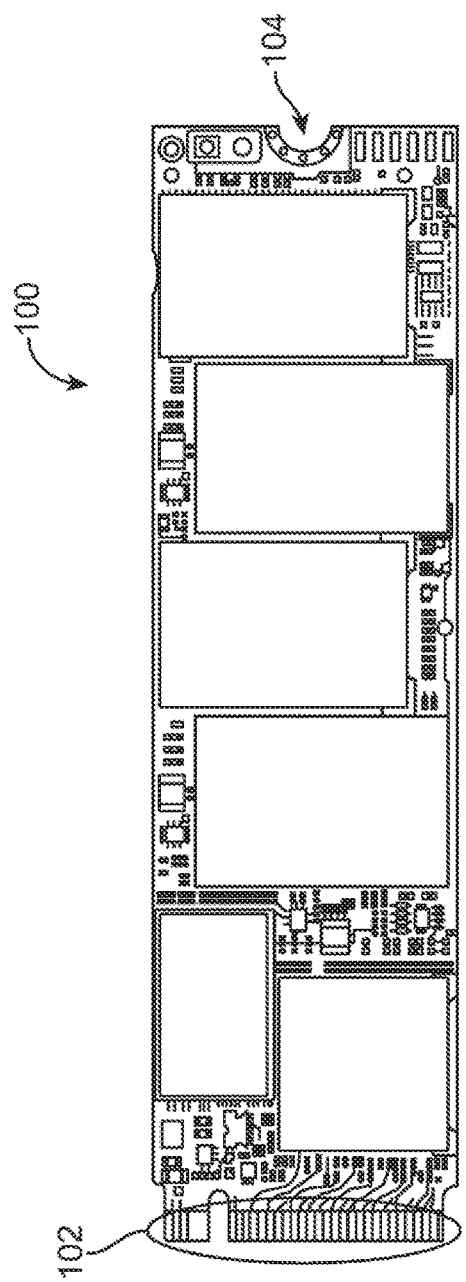
FIG. 1 is a top view illustrating an exemplary M.2 solid state drive.

Referring to FIG. 1, there is shown a top view of an exemplary electronic device 100 such as a memory expansion card. In this example, electronic device 100 is a SSD storage card and more specifically an M.2 drive. While embodiments of the present disclosure are described herein in the context of an exemplary M.2 drive, the invention applies to any type of electronic device having a similar general shape, i.e., relatively flat and substantially rectangular, that may have different dimensions and constructions than those of the M.2 card. As depicted in FIG. 1, M.2 drive 100 is a relatively flat, substantially rectangular piece that includes various functional components mounted on a PCB. The various components may include, for example, NAND flash memory chips, memory controller, interface controller, an interface connector 102 such as SATA, PCI, etc. In the case of this specific type of M.2 drive 100 there is also provided a mounting cutout or hole 104 at an edge of the PCB opposite to the edge with interface connector 102. When installed on a host substrate such as an adapter card, add-in card or a PC motherboard, interface connector 102 is inserted into a mating connector on the host and a fastening mechanism such as a screw is used to secure M.2 drive 100 through mounting hole 104.

Figure 2:
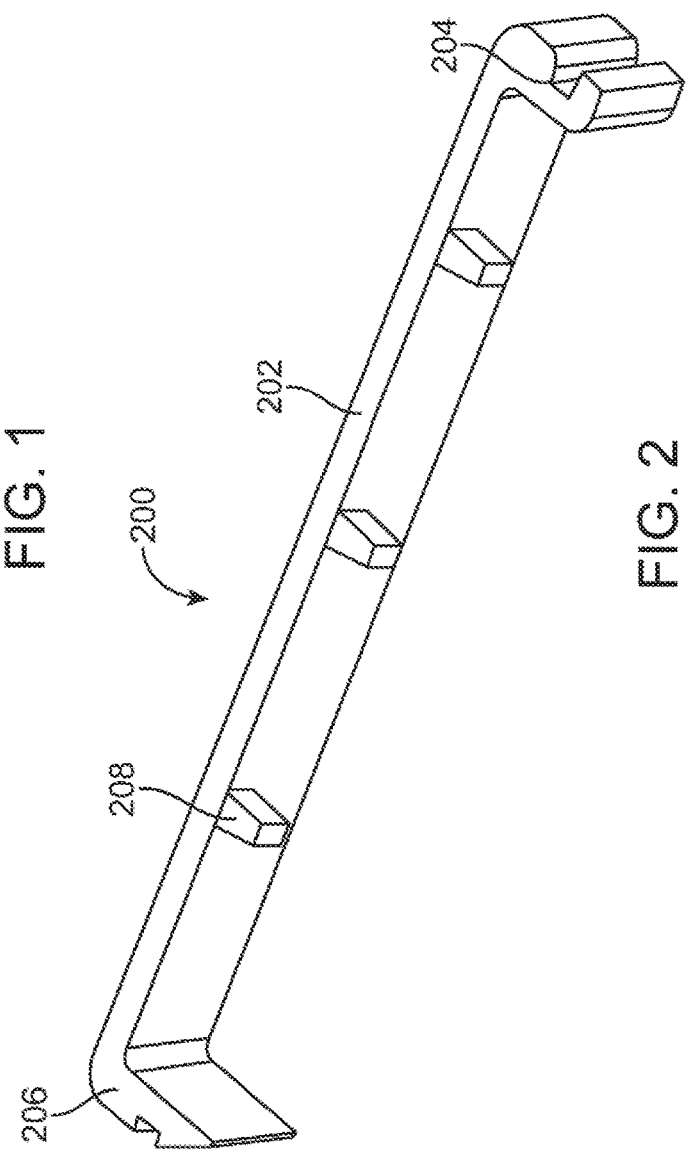
FIG. 2 is a perspective view of a retainer clip according to an exemplary embodiment of the present disclosure.

Referring now to FIG. 2, there is shown a perspective view of a retainer clip 200 according to a first exemplary embodiment of the present disclosure. Retainer clip 200 includes a span 202 with a first board engagement feature BEF 204 at one end and a second board engagement feature BEF 206 at the opposite end of span 202. In this exemplary embodiment, board engagement feature BEF 204 provides an interlocking mechanism that is inserted into an optimally dimensioned and positioned cutout on the host substrate, and board engagement feature BEF 206 is a spring finger locking mechanism that snaps into place through another optimally dimensioned and positioned cutout on the host substrate. On an inner surface of span 202 is provided one or more alignment/retaining posts 208 positioned at predetermined distances from each board engagement feature and from each other. In the exemplary embodiment shown in FIG. 2, span 202 of retainer clip 200 is designed to house three alignment/retaining posts 208 that can secure up to three electronic devices. It is to be understood, however, that the number of alignment/retaining posts 208 can vary depending on the desired number of electronic devices to be secured.

Figure 3:
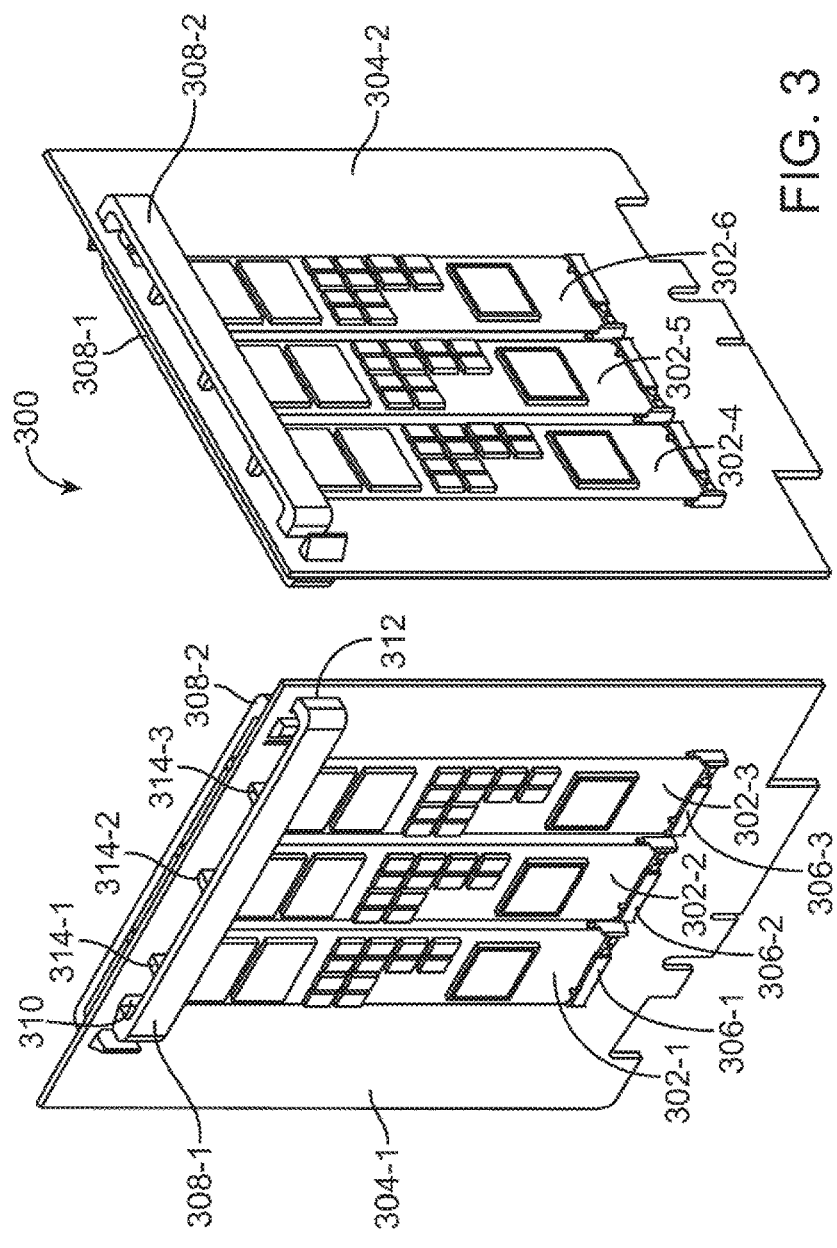
FIG. 3 provides perspective views of an assembly with one or more electronic devices securely mounted on an exemplary double-sided printed circuit board according to an exemplary embodiment of the present disclosure.
Figure 4:
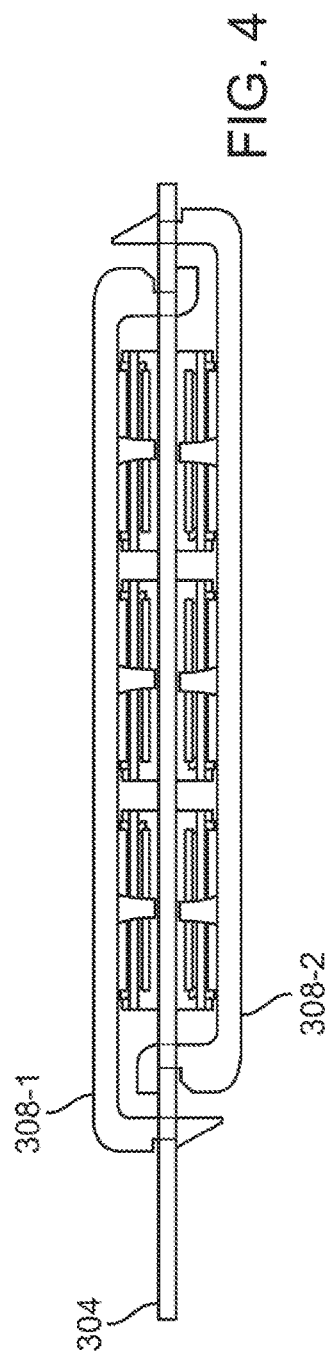
FIG. 4 is a side view of a double-sided printed circuit board with electronic devices installed thereon and secured with retainer clips according to an exemplary embodiment of the present disclosure.

Referring to FIG. 3, there is shown perspective views of an assembly 300 with one or more electronic devices 302 securely mounted on an exemplary double-sided printed circuit board PCB 304, according to an exemplary embodiment of the present disclosure. PCB 304 provides a substrate for installing, on a first surface 304-1, a first array of multiple, in this example three, electronic devices 302-1, 302-2 and 302-3, and on a second surface 304-2, a second array of multiple, in this example three, electronic devices 302-4, 302-5, 302-6. Each of electronic devices 302 may be, for example, an M.2 drive whose connector mates with a respective female connector 306 preinstalled on the first and second surfaces of PCB 304. A first retainer clip 308-1 of the type described in connection with FIG. 2 is utilized to secure the first array of electronic devices 302-1, 302-2 and 302-3 on first surface 304-1 of PCB 304. This is accomplished by first inserting an interlocking mechanism of the board engagement feature at one end of the span of retainer clip 308-1, into a first matching cutout at location 310 on PCB 304. A spring finger locking mechanism of board engagement feature at the other end of the span of retainer clip 308-1 may then be snapped into a second cutout at location 312 on PCB 304. Once retainer clip 308-1 is fully engaged with PCB 304, alignment/retaining posts 314 of retainer clip 308-1 respectively engage the hole or cutout at one end of each of M.2 drives 302 (hole 104 in FIG. 1) such that each M.2 drive 302 is properly secured in place and its movement restricted in the X-Y-Z directions. Thus, the length of the retainer clip span and the spacing between alignment/retaining posts 314-1, 314-2 and 314-3 may vary depending on the width of the array of M.2 drives 302 and the spacing therebetween. A second retainer clip 308-2 may be used in a similar fashion to secure the second array of electronic devices 302-4, 302-5, 302-6 on second surface 304-2 of PCB 304. To maximize the compactness of assembly 300, in the exemplary embodiment shown in FIG. 3, the span overlap between retainer clips 308-1 and 308-2 is maximized. This is accomplished by designing the spacing between BEFs and alignment/retaining posts in order to accommodate the BEF of the second retainer clip on the opposite side of the PCB. Exemplary dimensions for spacing between BEF and alignment/retaining posts are further described in connection with FIG. 5A. Locations of the four cutouts on PCB 304 (e.g., 310 and 312) are adjusted to correspond to the BEFs of retainer clips 308-1 and 308-2. FIG. 4 shows a cross-sectional view of assembly 300 with an array of electronic devices such as M.2 drives mounted on each surface of PCB 304 and securely fastened by retainer clips 308. Once all electronic devices 302 are securely mounted on PCB 304, PCB 304 may electrically connect to a system, such as a tester, that can electrically communicate with each electronic device 302 for testing or other purposes.

It is to be understood that while assembly 300 is described herein as a double-sided PCB with an array of electronic devices mounted on each side, many variations and alternatives are possible. For example, PCB 304 need not be double-sided and may instead house devices only on one surface. Also, the array of electronic devices may include fewer than the three shown in the exemplary embodiment.

While the same exemplary embodiment shown in FIG. 3 may hold fewer than three electronic devices per side, it is possible to modify aspects of the design for a more compact assembly. For example, by shortening the length of the span of retainer clip 310 and a commensurate shortening of the distance between the PCB cutouts 310 and 312, as well as reducing the number of alignment/retaining posts 314, a more compact assembly that securely holds fewer electronic devices 302 is possible. Similarly, the design of assembly 300 may be modified to accommodate an increased number of devices per array. For example, to hold four electronic devices 302 per side, a retainer clip 308 with longer span and an additional alignment/retaining post 314 may be used on a PCB surface that includes four connectors 306. Locations 310 and 312 for board engagement features of the modified retainer clip may also be adjusted to fit the longer clip span as defined by the width of the array of electronic devices. The optimal number of electronic devices and the optimal overall size of assembly 300 depends on the application. Various aspects of the design of the exemplary assembly 300 including size of retainer clip 308 and the number of alignment/retaining posts 314 will be described below.

Figure 5A:
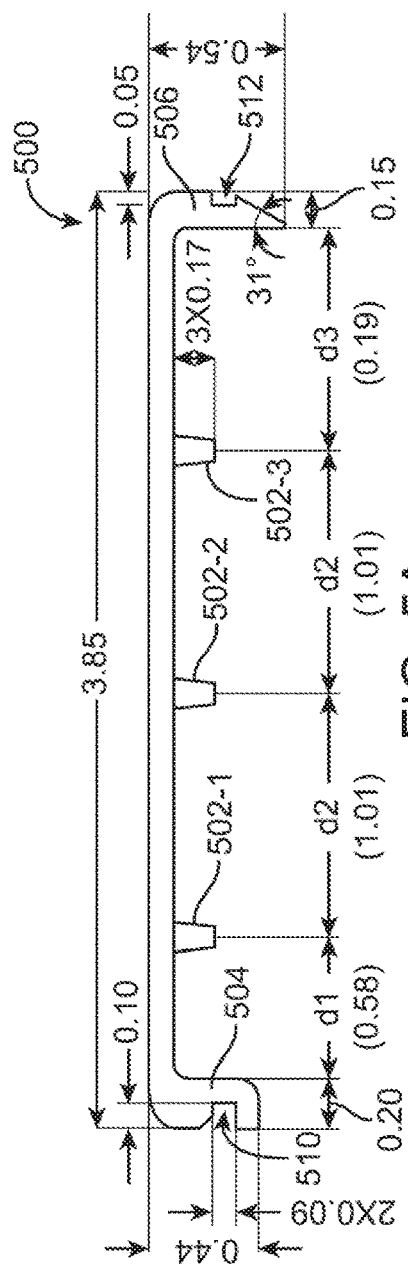
FIGS. 5A and 5B respectively show a side view and top view respectively of a retainer clip according to an exemplary embodiment of the present disclosure.

Referring to FIG. 5A, there is shown a side view of a retainer clip 500 along with exemplary dimensions for an exemplary implementation designed for securing three M.2 SSDs. Retainer clip 500 thus includes three alignment/retaining posts 502-1, 502-2 and 502-3. The spacing between alignment/retaining posts 502 may vary but takes into account the width of each M.2 SSD and the spacing between the M.2 SSDs. The width of an M.2 SSD may be, for example, 22 mm, or about 0.866 inches. To accommodate three M.2 SSDs that are installed side by side, in the exemplary embodiment shown in FIG. 5A, alignment/retaining posts 502 are spaced apart by a distance d2 of, for example, 1.01 inches. A distance d1 between alignment/retaining post 502-1 and the inner wall of first board engagement feature 504 which is, in this example, in the form of an interlocking mechanism, is, for example, 0.58 inches. And a distance d3 between alignment/retaining post 502-3 and an inner wall of second board engagement feature 506 which is, in this example, a spring finger locking mechanism, is, for example, 0.91 inches. In the exemplary embodiment of FIG. 5A, distance d3 is made larger than distance d1 in order to accommodate a compact double-sided implementation. That is, for a compact assembly, BEF 504 from the clip on the second side of the PCB may reside in the d3 region of the first side of the PCB as shown in FIGS. 3 and 4. Distance d3 is therefore extended just enough to maximize the span overlap between the two retainer clips in a double-sided assembly. Otherwise distance d3 could be about the same as distance d1. Given a width of, for example, 0.20 inches, for the maximum thickness of BEF 504 and a width of, for example, 0.15 inches for the maximum width of BEF 506, retainer clip 500 would have a length of about, for example, 3.85 inches in its total span. Indentation 510 in the interlocking mechanism of BEF 504 is, in this example, 0.10 inches deep and 0.44 inches in height, while indentation 512 in the spring finger locking mechanism of BEF 506 is, for example, 0.05 inches deep and 0.44 inches in height. The size of each indentation 510 and 512 is designed to accommodate the thickness of the PCB that retainer clip 500 engages with. Further, each alignment/retaining post 502 in this exemplary embodiment has a tapered profile with a height of about, for example, 0.17 inches. Retainer clip 500 may be made of materials such as metal, plastic, non-metals, or any combination of materials.

Figure 5B:
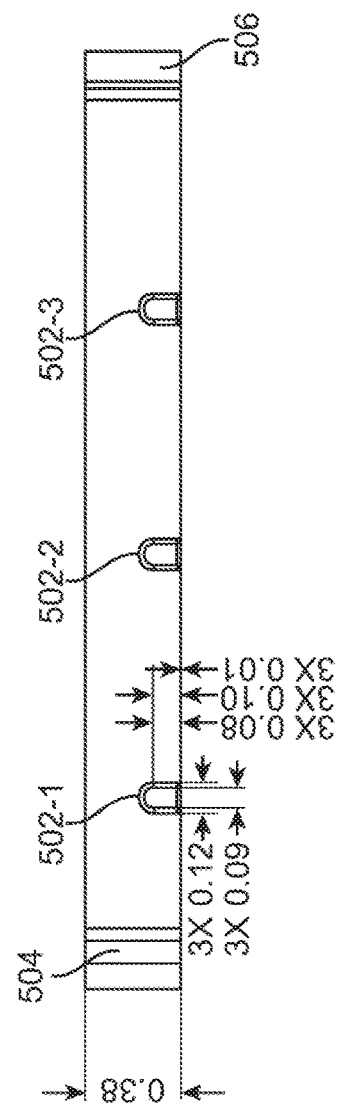

A top view of the inner surface of the span of the exemplary retainer clip 500 is shown in FIG. 5B. According to this exemplary embodiment, the width of retainer clip 500 is about, for example, 0.38 inches. Alignment/retaining posts 502 are tapered with a width of, for example, 0.12 inches at their base tapering to a width of, for example, 0.09 inches at the top. In this exemplary embodiment, alignment/retaining posts 502 are disposed closest to one edge of the inner surface of the span, spaced for example 0.01 inches from one edge of the span. This results in a more compact overall assembly, although other embodiments could place posts 502 anywhere along the width of the span.

Figure 6:
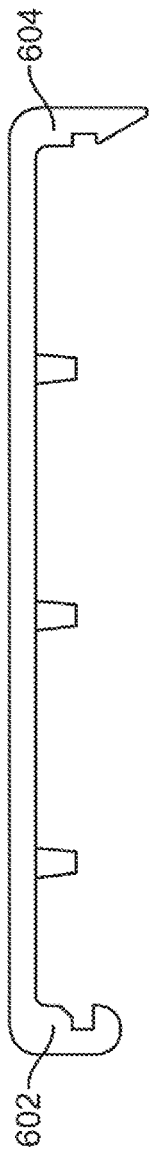
FIG. 6 is a side view of a retainer clip with alternative board engagement features according to another exemplary embodiment of the present disclosure.

Embodiments of the present disclosure provide tools and techniques for reliable and efficient fastening of electronic devices onto a substrate. The above exemplary embodiments have been described in some detail for purposes of illustration and to gain a better understanding of the various aspects of the present invention. Many alternatives and modifications are possible. For example, all numerical sizes and dimensions for retainer clip 500, as illustrated in FIGS. 5A and 5B, may vary not only based on the size and the number of the electronic devices to be fastened but also based on what material or manufacturing process is used to fabricate the retainer clip. Different mechanisms can be employed to implement the board engagement features of the retainer clip. Further, the manner in which the retainer clip engages with the PCB can be modified. For example, instead of BEF mechanisms that provide for insertion into cutouts or holes in the inner surface of the PCB, a modified BEF can attach the retainer clip to the board along the edges of the PCB. An example of such mechanism is shown in FIG. 6 where retainer clip 600 includes board engagement features 602 and 604 that engage with the edges of a PCB. In yet another example of variations, to increase the density of electronic devices, multiple arrays of electronic devices can be secured on the same side of the PCB using a corresponding number of retainer clips. The above described embodiments are therefore illustrative and not limiting with respect to the scope of the present invention, which scope is defined by the claims set forth below.

What is claimed is:
1. A retainer clip for fastening a plurality of electronic devices to a circuit board, comprising:
   a longitudinal span section that accommodates the plurality of electronic devices, where each electronic device has a predetermined width;
   a first board engagement feature formed at a first end of the longitudinal span section, and a second board engagement feature formed at a second end of the longitudinal span section; and
   a plurality of retaining posts formed on an inner surface of the span section, each of the retaining posts positioned on the longitudinal span section based on the predetermined width of a corresponding electronic device in order to align with and engage a mounting feature of the corresponding electronic device,
   wherein the span section and the plurality of retaining posts are positioned such that the plurality of electronic devices are securely and reliably installed on the circuit board by the first board engagement feature of the retainer clip engaging the circuit board via a first predefined mounting feature of the circuit board, and the second board engagement feature of the retainer clip engaging a second predefined mounting feature of the circuit board.

2. The retainer clip of claim 1, wherein the first board engagement feature comprises an interlocking mechanism and the second board engagement feature comprises a spring finger locking mechanism.

3. The retainer clip of claim 2, wherein the interlocking mechanism of the first board engagement feature comprises an indentation having a size substantially same as a thickness of the circuit board.

4. The retainer clip of claim 3, wherein the spring finger locking mechanism of the second board engagement feature comprises an indentation having a size substantially same as a thickness of the circuit board.

5. The retainer clip of claim 4, wherein the plurality of retaining posts are wider at the base resulting in a tapered profile.

6. The retainer clip of claim 4, wherein the plurality of retaining posts are disposed closer to one edge of the longitudinal span section.

7. The retainer clip of claim 1, wherein the plurality of electronic devices comprise an M.2 solid state drive card.

8. The retainer clip of claim 7, wherein the plurality of retaining posts are spaced from each other based on a width of the M.2 solid state drive card such that, when the retainer clip engages with the circuit board, each of the plurality of posts aligns with a mounting feature of a respective M.2 solid state drive card.

9. An electronic assembly comprising:
a circuit board with a first plurality of board connectors installed side by side on a first surface of the circuit board;
a first plurality of electronic devices, each with a mating connector inserted into a corresponding one of the first plurality of board connectors; and
a first retaining clip with a span section having a first board engagement feature at a first end of the span section and a second board engagement feature at a second end of the span section, the first retaining clip further comprising a plurality of retaining posts protruding from an inner surface of the span section, the plurality of retaining posts being positioned based on a predetermined width of each of the first plurality of electronic devices,
wherein the first retaining clip engages the circuit board over the first plurality of electronic devices, and each of the plurality of retaining posts of the first retaining clip align with and engage a corresponding mounting feature of a respective one of the first plurality of electronic devices.

10. The electronic assembly of claim 9 wherein the first board engagement feature comprises an interlocking mechanism.

11. The electronic assembly of claim 9, further comprising:
a second plurality of board connectors installed side by side on a second surface of the circuit board opposite the first surface of the circuit board;
a second plurality of electronic devices, each with a mating connector inserted into a corresponding one of the second plurality of board connectors; and
a second retaining clip with a span section having a first board engagement feature at a first end of the span section and a second board engagement feature at a second end of the span section, the second retaining clip further comprising a plurality of retaining posts protruding from an inner surface of the span section, the plurality of retaining posts being positioned based on a predetermined width of each of the second plurality of electronic devices,
wherein the second retaining clip engages the circuit board over the second plurality of electronic devices, and the plurality of retaining posts of the second retaining clip align with and engage a corresponding mounting feature of a respective one of the second plurality of electronic devices.

12. The electronic assembly of claim 9, wherein the first plurality of electronic devices comprises M.2 solid state drive cards.

13. The electronic assembly of claim 12, wherein the circuit board is coupled to a test system for testing the M.2 solid state drive cards.

14. The electronic assembly of claim 9, wherein the second board engagement feature comprises a spring finger locking mechanism.

15. The electronic assembly of claim 14, wherein the interlocking mechanism of the first board engagement feature comprises an indentation having a size substantially same as a thickness of the circuit board.

16. The electronic assembly of claim 15, wherein the spring finger locking mechanism of the second board engagement feature comprises an indentation having a size substantially same as a thickness of the circuit board.

17. The electronic assembly of claim 9, wherein each of the plurality of retaining posts is wider at the base resulting in a tapered profile.

18. The electronic assembly of claim 9, wherein the plurality of retaining posts is disposed closer to one edge of the span section.

19. An electronic assembly comprising:
a circuit board with a first plurality of board connectors installed side by side on the circuit board, and a second plurality of board connectors installed side by side on the circuit board;
a first plurality of electronic devices each with a mating connector inserted into a corresponding one of the first plurality of board connectors;
a second plurality of electronic devices each with a mating connector inserted into a corresponding one of the second plurality of board connectors;
a first retaining clip with a span section having a plurality of retaining posts protruding from an inner surface of the span section and being positioned based on a predetermined width of each of the first plurality of electronic devices; and
a second retaining clip with a span section having a plurality of retaining posts protruding from an inner surface of the span section and being positioned based on a predetermined width of each of the second plurality of electronic devices,
wherein the first retaining clip engages the circuit board over the first plurality of electronic devices, and each of the plurality of retaining posts of the first retaining clip align with and engage a corresponding mounting feature of a respective one of the first plurality of electronic devices, and
wherein the second retaining clip engages the circuit board over the second plurality of electronic devices, and each of the plurality of retaining posts of the second retaining clip align with and engage a corresponding mounting feature of a respective one of the second plurality of electronic devices.

20. The electronic assembly of claim 19, wherein the first plurality of board connectors is disposed on a first surface of the circuit board, and the second plurality of board connectors is disposed on a second surface opposite to the first surface of the circuit board.

\* \* \* \* \*